(12) United States Patent
Mardian et al.

(10) Patent No.: US 7,581,511 B2
(45) Date of Patent: Sep. 1, 2009

(54) APPARATUS AND METHODS FOR MANUFACTURING MICROFEATURES ON WORKPIECES USING PLASMA VAPOR PROCESSES

(75) Inventors: Allen P. Mardian, Boise, ID (US); Santiago R. Rodriguez, Boise, ID (US)

(73) Assignee: Micron Technology, Inc., Boise, ID (US)

(*) Notice: Subject to any disclaimer, the term of this patent is extended or adjusted under 35 U.S.C. 154(b) by 786 days.

(21) Appl. No.: 10/683,424

(22) Filed: Oct. 10, 2003

(65) Prior Publication Data
US 2005/0087302 A1  Apr. 28, 2005

(51) Int. Cl.
*C23C 16/00* (2006.01)
*C23F 1/00* (2006.01)
*H01L 21/306* (2006.01)

(52) U.S. Cl. ............... 118/723 MW; 156/345.36; 156/345.41; 156/345.35; 118/723 ER

(58) Field of Classification Search ............ 156/345.36, 156/345.41, 345.35; 118/723 MW, 723 ER
See application file for complete search history.

(56) References Cited

U.S. PATENT DOCUMENTS

| 127,031 | A | 5/1872 | Dayton |
|---|---|---|---|
| 131,943 | A | 10/1872 | Dayton |
| 579,269 | A | 3/1897 | Hent |
| 1,741,519 | A | 12/1929 | Huff |
| 2,508,500 | A | 5/1950 | de Lange |
| RE24,291 | E | 3/1957 | Goodyer |
| 3,522,836 | A | 8/1970 | King |
| 3,618,919 | A | 11/1971 | Beck |
| 3,620,934 | A | 11/1971 | Endle |
| 3,630,769 | A | 12/1971 | Hart et al. |
| 3,630,881 | A | 12/1971 | Lester et al. |
| 3,634,212 | A | 1/1972 | Valayll et al. |

(Continued)

FOREIGN PATENT DOCUMENTS

DE  4003882  8/1991

(Continued)

OTHER PUBLICATIONS

U.S. Appl. No. 10/767,298, filed Jan. 28, 2004, Zheng et al.

(Continued)

*Primary Examiner*—Parviz Hassanzadeh
*Assistant Examiner*—Rakesh K Dhingra
(74) *Attorney, Agent, or Firm*—Perkins Coie LLP

(57) ABSTRACT

A reactor comprising an energy source, a plasma unit positioned relative to the energy source, and a processing vessel connected to the plasma unit. The energy source has a generator that produces a plasma energy and a transmitter to transmit the plasma energy. The plasma unit has a first portion or transmissive portion through which the plasma energy can propagate, a second portion or distributor portion having a plurality of outlets, and a chamber in fluid communication with the plurality of outlets. The chamber is generally between or within the first and second portions. The plasma energy can pass through at least the first portion and into the chamber to create a plasma in the chamber. The second portion can also be transmissive or opaque to the plasma energy. The processing vessel includes a workpiece holder across from the outlets of the second portion of the plasma unit.

4 Claims, 6 Drawing Sheets

U.S. PATENT DOCUMENTS

| | | | |
|---|---|---|---|
| 3,744,771 A | 7/1973 | Deaton | |
| 3,945,804 A | 3/1976 | Shang et al. | |
| 4,018,949 A | 4/1977 | Donokowski et al. | |
| 4,022,928 A | 5/1977 | Piwcyzk et al. | |
| 4,098,923 A | 7/1978 | Alberti et al. | |
| 4,242,182 A | 12/1980 | Popescu | |
| 4,242,370 A | 12/1980 | Abdalla et al. | |
| 4,269,625 A | 5/1981 | Molenaar | |
| 4,289,061 A | 9/1981 | Emmett | |
| 4,313,783 A | 2/1982 | Davies et al. | |
| 4,388,342 A | 6/1983 | Suzuki et al. | |
| 4,397,753 A | 8/1983 | Czaja | |
| 4,436,674 A | 3/1984 | McMenamin | |
| 4,438,724 A | 3/1984 | Doehler et al. | |
| 4,469,801 A | 9/1984 | Hirai et al. | |
| 4,492,716 A | 1/1985 | Yamazaki et al. | |
| 4,509,456 A | 4/1985 | Kleinert et al. | |
| 4,545,136 A | 10/1985 | Izu et al. | |
| 4,590,042 A | 5/1986 | Drage | |
| 4,593,644 A | 6/1986 | Hanak | |
| 4,595,399 A | 6/1986 | Collins et al. | |
| 4,615,904 A | 10/1986 | Ehrlich et al. | |
| 4,681,777 A | 7/1987 | Engelken et al. | |
| 4,721,629 A | 1/1988 | Sakai et al. | |
| 4,738,295 A | 4/1988 | Genser et al. | |
| 4,780,178 A | 10/1988 | Yoshida et al. | |
| 4,821,302 A | 4/1989 | Whitlock et al. | |
| 4,826,579 A | 5/1989 | Westfall | |
| 4,832,115 A | 5/1989 | Albers et al. | |
| 4,871,417 A | 10/1989 | Nishizawa et al. | |
| 4,894,132 A | 1/1990 | Tanaka et al. | |
| 4,911,638 A | 3/1990 | Bayne et al. | |
| 4,923,715 A | 5/1990 | Matsuda et al. | |
| 4,948,979 A | 8/1990 | Munakata et al. | |
| 4,949,669 A | 8/1990 | Ishii et al. | |
| 4,962,057 A | 10/1990 | Epler et al. | |
| 4,966,646 A | 10/1990 | Zdeblick | |
| 4,977,106 A | 12/1990 | Smith | |
| 4,988,879 A | 1/1991 | Zare et al. | |
| 5,015,330 A | 5/1991 | Okumura et al. | |
| 5,017,404 A | 5/1991 | Paquet et al. | |
| 5,020,476 A | 6/1991 | Bay et al. | |
| 5,062,446 A | 11/1991 | Anderson | |
| 5,065,697 A | 11/1991 | Yoshida et al. | |
| 5,076,205 A | 12/1991 | Vowles et al. | |
| 5,090,985 A | 2/1992 | Soubeyrand | |
| 5,091,207 A | 2/1992 | Tanaka | |
| 5,131,752 A | 7/1992 | Yu et al. | |
| 5,136,975 A | 8/1992 | Bartholomew et al. | |
| 5,139,606 A | 8/1992 | Maki | |
| 5,172,849 A | 12/1992 | Barten et al. | |
| 5,178,683 A | 1/1993 | Takamura et al. | |
| 5,200,023 A | 4/1993 | Gifford et al. | |
| 5,223,113 A | 6/1993 | Kaneko et al. | |
| 5,232,749 A | 8/1993 | Gilton | |
| 5,248,527 A | 9/1993 | Uchida et al. | |
| 5,286,296 A | 2/1994 | Sato et al. | |
| 5,325,020 A * | 6/1994 | Campbell et al. ...... 315/111.21 | |
| 5,364,219 A | 11/1994 | Takahashi et al. | |
| 5,366,557 A | 11/1994 | Yu | |
| 5,372,837 A | 12/1994 | Shimoyama et al. | |
| 5,377,429 A | 1/1995 | Sandhu et al. | |
| 5,378,502 A | 1/1995 | Willard et al. | |
| 5,380,396 A | 1/1995 | Shikida et al. | |
| 5,409,129 A | 4/1995 | Tsukada et al. | |
| 5,418,180 A | 5/1995 | Brown | |
| 5,421,957 A | 6/1995 | Carlson et al. | |
| 5,427,666 A | 6/1995 | Mueller et al. | |
| 5,432,015 A | 7/1995 | Wu et al. | |
| 5,433,787 A * | 7/1995 | Suzuki et al. ......... 118/723 MP | |
| 5,433,835 A | 7/1995 | Demaray et al. | |
| 5,445,491 A | 8/1995 | Nakagawa et al. | |
| 5,453,124 A | 9/1995 | Moslehi et al. | |
| 5,474,612 A | 12/1995 | Sato et al. | |
| 5,477,623 A | 12/1995 | Tomizawa et al. | |
| 5,480,818 A | 1/1996 | Matsumoto et al. | |
| 5,496,410 A | 3/1996 | Fukuda et al. | |
| 5,498,292 A | 3/1996 | Ozaki | |
| 5,500,256 A | 3/1996 | Watabe | |
| 5,505,986 A | 4/1996 | Velthaus et al. | |
| 5,522,934 A | 6/1996 | Suzuki et al. | |
| 5,527,396 A | 6/1996 | Saitoh et al. | |
| 5,532,190 A | 7/1996 | Goodyear et al. | |
| 5,536,317 A | 7/1996 | Crain et al. | |
| 5,558,717 A | 9/1996 | Zhao et al. | |
| 5,562,800 A | 10/1996 | Kawamura | |
| 5,569,350 A | 10/1996 | Osada et al. | |
| 5,575,883 A * | 11/1996 | Nishikawa ............. 156/345.34 | |
| 5,589,002 A | 12/1996 | Su | |
| 5,589,110 A | 12/1996 | Motoda et al. | |
| 5,592,581 A | 1/1997 | Okase | |
| 5,595,606 A | 1/1997 | Fujikawa et al. | |
| 5,599,513 A | 2/1997 | Masaki et al. | |
| 5,609,798 A | 3/1997 | Liu et al. | |
| 5,624,498 A | 4/1997 | Lee et al. | |
| 5,626,936 A | 5/1997 | Alderman | |
| 5,640,751 A | 6/1997 | Faria | |
| 5,643,394 A | 7/1997 | Maydan et al. | |
| 5,654,589 A | 8/1997 | Huang et al. | |
| 5,658,503 A | 8/1997 | Johnston et al. | |
| 5,683,538 A | 11/1997 | O'Neill et al. | |
| 5,693,288 A | 12/1997 | Nakamura | |
| 5,716,796 A | 2/1998 | Bull et al. | |
| 5,729,896 A | 3/1998 | Dalal et al. | |
| 5,733,375 A | 3/1998 | Fukuda et al. | |
| 5,746,434 A | 5/1998 | Boyd et al. | |
| 5,754,297 A | 5/1998 | Nulman | |
| 5,766,364 A | 6/1998 | Ishida et al. | |
| 5,769,950 A | 6/1998 | Takasu et al. | |
| 5,769,952 A | 6/1998 | Komino | |
| 5,772,771 A | 6/1998 | Li et al. | |
| 5,773,085 A | 6/1998 | Inoue et al. | |
| 5,788,778 A | 8/1998 | Shang et al. | |
| 5,792,269 A | 8/1998 | Deacon et al. | |
| 5,792,700 A | 8/1998 | Turner et al. | |
| 5,803,938 A | 9/1998 | Yamaguchi et al. | |
| 5,819,683 A | 10/1998 | Ikeda et al. | |
| 5,820,641 A | 10/1998 | Gu et al. | |
| 5,820,686 A | 10/1998 | Moore | |
| 5,827,370 A | 10/1998 | Gu | |
| 5,833,888 A | 11/1998 | Arya et al. | |
| 5,846,275 A | 12/1998 | Lane et al. | |
| 5,846,330 A | 12/1998 | Quirk et al. | |
| 5,851,294 A | 12/1998 | Young et al. | |
| 5,851,849 A | 12/1998 | Comizzoli et al. | |
| 5,865,417 A | 2/1999 | Harris et al. | |
| 5,865,887 A | 2/1999 | Wijaranakula et al. | |
| 5,866,986 A * | 2/1999 | Pennington ............. 315/111.21 | |
| 5,868,159 A | 2/1999 | Loan et al. | |
| 5,879,459 A | 3/1999 | Gadgil et al. | |
| 5,879,516 A | 3/1999 | Kasman | |
| 5,885,425 A | 3/1999 | Hsieh et al. | |
| 5,895,530 A | 4/1999 | Shrotriya et al. | |
| 5,902,403 A | 5/1999 | Aitani et al. | |
| 5,908,947 A | 6/1999 | Vaartstra | |
| 5,911,238 A | 6/1999 | Bump et al. | |
| 5,932,286 A | 8/1999 | Beinglass et al. | |
| 5,936,829 A | 8/1999 | Moslehi | |
| 5,940,684 A | 8/1999 | Shakuda et al. | |
| 5,953,634 A | 9/1999 | Kajita et al. | |
| 5,956,613 A | 9/1999 | Zhao et al. | |
| 5,958,140 A | 9/1999 | Arami et al. | |
| 5,961,775 A * | 10/1999 | Fujimura et al. ....... 156/345.29 | |
| 5,963,336 A | 10/1999 | McAndrew et al. | |

| Patent No. | Date | Inventor |
|---|---|---|
| 5,968,275 A * | 10/1999 | Lee et al. ................. 118/723 R |
| 5,968,587 A | 10/1999 | Frankel |
| 5,972,430 A | 10/1999 | DiMeo, Jr. et al. |
| 5,994,181 A | 11/1999 | Hsieh et al. |
| 5,997,588 A | 12/1999 | Goodwin et al. |
| 5,998,932 A | 12/1999 | Lenz |
| 6,006,694 A | 12/1999 | DeOrnellas et al. |
| 6,008,086 A | 12/1999 | Schuegraf et al. |
| 6,016,611 A | 1/2000 | White et al. |
| 6,022,483 A | 2/2000 | Aral |
| 6,025,110 A | 2/2000 | Nowak |
| 6,032,923 A | 3/2000 | Biegelsen et al. |
| 6,039,557 A | 3/2000 | Unger et al. |
| 6,042,652 A | 3/2000 | Hyun et al. |
| 6,045,620 A | 4/2000 | Tepman et al. |
| 6,059,885 A | 5/2000 | Ohashi et al. |
| 6,062,256 A | 5/2000 | Miller et al. |
| 6,070,551 A | 6/2000 | Li et al. |
| 6,079,426 A | 6/2000 | Subrahmanyam et al. |
| 6,080,446 A | 6/2000 | Tobe et al. |
| 6,086,677 A | 7/2000 | Umotoy et al. |
| 6,089,543 A | 7/2000 | Freerks |
| 6,090,210 A | 7/2000 | Ballance et al. |
| 6,109,206 A | 8/2000 | Maydan et al. |
| 6,113,698 A | 9/2000 | Raaijmakers et al. |
| 6,123,107 A | 9/2000 | Selser et al. |
| 6,129,331 A | 10/2000 | Henning et al. |
| 6,139,700 A | 10/2000 | Kang et al. |
| 6,142,163 A | 11/2000 | McMillin et al. |
| 6,143,077 A | 11/2000 | Ikeda et al. |
| 6,143,078 A | 11/2000 | Ishikawa et al. |
| 6,143,659 A | 11/2000 | Leem |
| 6,144,060 A | 11/2000 | Park et al. |
| 6,149,123 A | 11/2000 | Harris et al. |
| 6,156,393 A | 12/2000 | Polanyi et al. |
| 6,159,297 A | 12/2000 | Herchen et al. |
| 6,159,298 A | 12/2000 | Saito et al. |
| 6,160,243 A | 12/2000 | Cozad |
| 6,161,500 A | 12/2000 | Kopacz et al. |
| 6,173,673 B1 | 1/2001 | Golovato et al. |
| 6,174,366 B1 | 1/2001 | Ihantola |
| 6,174,377 B1 | 1/2001 | Doering et al. |
| 6,174,809 B1 | 1/2001 | Kang et al. |
| 6,178,660 B1 | 1/2001 | Emmi et al. |
| 6,179,923 B1 | 1/2001 | Yamamoto et al. |
| 6,182,603 B1 | 2/2001 | Shang et al. |
| 6,183,563 B1 | 2/2001 | Choi et al. |
| 6,190,459 B1 | 2/2001 | Takeshita et al. |
| 6,192,827 B1 | 2/2001 | Welch et al. |
| 6,193,802 B1 | 2/2001 | Pang et al. |
| 6,194,628 B1 | 2/2001 | Pang et al. |
| 6,197,119 B1 | 3/2001 | Dozoretz et al. |
| 6,199,465 B1 | 3/2001 | Hattori et al. |
| 6,200,415 B1 | 3/2001 | Maraschin |
| 6,203,613 B1 | 3/2001 | Gates et al. |
| 6,206,967 B1 | 3/2001 | Mak et al. |
| 6,206,972 B1 | 3/2001 | Dunham |
| 6,207,937 B1 | 3/2001 | Stoddard et al. |
| 6,210,754 B1 | 4/2001 | Lu et al. |
| 6,211,033 B1 | 4/2001 | Sandhu et al. |
| 6,211,078 B1 | 4/2001 | Mathews |
| 6,214,714 B1 | 4/2001 | Wang et al. |
| 6,217,704 B1 | 4/2001 | Kitagawa et al. |
| 6,237,394 B1 | 5/2001 | Harris et al. |
| 6,237,529 B1 | 5/2001 | Spahn |
| 6,245,192 B1 | 6/2001 | Dhindsa et al. |
| 6,251,190 B1 | 6/2001 | Mak et al. |
| 6,255,222 B1 | 7/2001 | Xia et al. |
| 6,263,829 B1 | 7/2001 | Schneider et al. |
| 6,264,788 B1 | 7/2001 | Tomoyasu et al. |
| 6,270,572 B1 | 8/2001 | Kim et al. |
| 6,273,954 B2 | 8/2001 | Nishikawa et al. |
| 6,277,763 B1 | 8/2001 | Kugimiya et al. |
| 6,280,584 B1 | 8/2001 | Kumar et al. |
| 6,287,965 B1 | 9/2001 | Kang et al. |
| 6,287,980 B1 | 9/2001 | Hanazaki et al. |
| 6,290,491 B1 | 9/2001 | Shahvandi et al. |
| 6,291,337 B1 | 9/2001 | Sidhwa |
| 6,294,394 B1 | 9/2001 | Erickson et al. |
| 6,297,539 B1 | 10/2001 | Ma et al. |
| 6,302,964 B1 | 10/2001 | Umotoy et al. |
| 6,302,965 B1 | 10/2001 | Umotoy et al. |
| 6,303,953 B1 | 10/2001 | Doan et al. |
| 6,305,314 B1 | 10/2001 | Sneh et al. |
| 6,309,161 B1 | 10/2001 | Hofmeister |
| 6,315,859 B1 | 11/2001 | Donohoe |
| 6,328,803 B2 | 12/2001 | Rolfson et al. |
| 6,329,297 B1 | 12/2001 | Balish et al. |
| 6,333,272 B1 | 12/2001 | McMillin et al. |
| 6,334,928 B1 | 1/2002 | Sekine et al. |
| 6,342,277 B1 | 1/2002 | Sherman |
| 6,346,477 B1 | 2/2002 | Kaloyeros et al. |
| 6,347,602 B2 | 2/2002 | Goto et al. |
| 6,347,918 B1 | 2/2002 | Blahnik |
| 6,355,561 B1 | 3/2002 | Sandhu et al. |
| 6,358,323 B1 | 3/2002 | Schmitt et al. |
| 6,364,219 B1 | 4/2002 | Zimmerman et al. |
| 6,374,831 B1 | 4/2002 | Chandran et al. |
| 6,375,744 B2 | 4/2002 | Murugesh et al. |
| 6,383,300 B1 | 5/2002 | Saito et al. |
| 6,387,185 B2 | 5/2002 | Doering et al. |
| 6,387,207 B1 | 5/2002 | Janakiraman et al. |
| 6,387,324 B1 | 5/2002 | Patterson et al. |
| 6,402,806 B1 | 6/2002 | Schmitt et al. |
| 6,402,849 B2 | 6/2002 | Kwag et al. |
| 6,415,736 B1 | 7/2002 | Hao et al. |
| 6,419,462 B1 | 7/2002 | Horie et al. |
| 6,420,230 B1 | 7/2002 | Derderian et al. |
| 6,420,742 B1 | 7/2002 | Ahn et al. |
| 6,425,168 B1 | 7/2002 | Takaku et al. |
| 6,428,859 B1 | 8/2002 | Chiang et al. |
| 6,432,256 B1 | 8/2002 | Raoux |
| 6,432,259 B1 | 8/2002 | Noorbaksh et al. |
| 6,432,831 B2 | 8/2002 | Dhindsa et al. |
| 6,435,865 B1 | 8/2002 | Tseng et al. |
| 6,444,039 B1 | 9/2002 | Nguyen |
| 6,450,117 B1 | 9/2002 | Murugesh et al. |
| 6,451,119 B2 | 9/2002 | Sneh et al. |
| 6,454,912 B1 | 9/2002 | Ahn et al. |
| 6,458,416 B1 | 10/2002 | Derderian et al. |
| 6,461,436 B1 | 10/2002 | Campbell et al. |
| 6,461,931 B1 | 10/2002 | Eldridge |
| 6,475,336 B1 | 11/2002 | Hubacek |
| 6,486,081 B1 | 11/2002 | Ishikawa et al. |
| 6,503,330 B1 | 1/2003 | Sneh et al. |
| 6,506,254 B1 | 1/2003 | Bosch et al. |
| 6,508,268 B1 | 1/2003 | Kouketsu et al. |
| 6,509,280 B2 | 1/2003 | Choi |
| 6,534,007 B1 | 3/2003 | Blonigan et al. |
| 6,534,395 B2 | 3/2003 | Werkhoven et al. |
| 6,534,423 B1 | 3/2003 | Turner |
| 6,540,838 B2 | 4/2003 | Sneh et al. |
| 6,541,353 B1 | 4/2003 | Sandhu et al. |
| 6,551,929 B1 | 4/2003 | Kori et al. |
| 6,562,140 B1 | 5/2003 | Bondestam et al. |
| 6,562,141 B2 | 5/2003 | Clarke |
| 6,573,184 B2 | 6/2003 | Park |
| 6,579,372 B2 | 6/2003 | Park |
| 6,579,374 B2 | 6/2003 | Bondestam et al. |
| 6,585,823 B1 | 7/2003 | Van Wijck |
| 6,592,709 B1 | 7/2003 | Lubomirsky |
| 6,596,085 B1 | 7/2003 | Schmitt et al. |
| 6,602,346 B1 | 8/2003 | Gochberg |
| 6,610,352 B2 | 8/2003 | Cheong et al. |
| 6,622,104 B2 | 9/2003 | Wang et al. |
| 6,630,201 B2 | 10/2003 | Chiang et al. |

| | | | |
|---|---|---|---|
| 6,635,965 B1 | 10/2003 | Lee et al. | |
| 6,638,672 B2 | 10/2003 | Deguchi | |
| 6,638,879 B2 | 10/2003 | Hsieh et al. | |
| 6,641,673 B2 | 11/2003 | Yang | |
| 6,656,282 B2 | 12/2003 | Kim et al. | |
| 6,656,540 B2 * | 12/2003 | Sakamoto et al. ............ 427/564 | |
| 6,663,713 B1 | 12/2003 | Robles et al. | |
| 6,666,982 B2 | 12/2003 | Brcka | |
| 6,673,196 B1 | 1/2004 | Oyabu | |
| 6,676,759 B1 | 1/2004 | Takagi et al. | |
| 6,686,594 B2 | 2/2004 | Ji et al. | |
| 6,689,220 B1 | 2/2004 | Nguyen | |
| 6,704,913 B2 | 3/2004 | Rossman | |
| 6,705,345 B1 | 3/2004 | Bifano | |
| 6,706,334 B1 | 3/2004 | Kobayashi et al. | |
| 6,716,284 B2 | 4/2004 | Campbell et al. | |
| 6,758,911 B2 | 7/2004 | Campbell et al. | |
| 6,770,145 B2 | 8/2004 | Saito et al. | |
| 6,773,507 B2 | 8/2004 | Jallepally et al. | |
| 6,787,463 B2 | 9/2004 | Mardian et al. | |
| 6,800,139 B1 | 10/2004 | Shinriki et al. | |
| 6,800,172 B2 | 10/2004 | Carpenter et al. | |
| 6,807,971 B2 | 10/2004 | Saito et al. | |
| 6,814,813 B2 | 11/2004 | Dando et al. | |
| 6,818,249 B2 | 11/2004 | Derderian | |
| 6,820,570 B2 | 11/2004 | Kilpela et al. | |
| 6,821,347 B2 | 11/2004 | Carpenter et al. | |
| 6,830,652 B1 * | 12/2004 | Ohmi et al. ............ 156/345.41 | |
| 6,838,114 B2 | 1/2005 | Capenter et al. | |
| 6,845,734 B2 * | 1/2005 | Carpenter et al. ... 118/723 MW | |
| 6,849,131 B2 | 2/2005 | Chen et al. | |
| 6,858,120 B2 | 2/2005 | Ahn et al. | |
| 6,858,264 B2 | 2/2005 | Dando et al. | |
| 6,861,094 B2 | 3/2005 | Derderian et al. | |
| 6,861,356 B2 | 3/2005 | Matsuse et al. | |
| 6,869,500 B2 | 3/2005 | Lee et al. | |
| 6,877,726 B1 | 4/2005 | Rindt et al. | |
| 6,878,402 B2 | 4/2005 | Chiang et al. | |
| 6,881,295 B2 | 4/2005 | Nagakura et al. | |
| 6,884,296 B2 | 4/2005 | Basceri et al. | |
| 6,887,521 B2 | 5/2005 | Basceri | |
| 6,890,386 B2 | 5/2005 | DeDontney et al. | |
| 6,905,547 B1 | 6/2005 | Londergan et al. | |
| 6,905,549 B2 | 6/2005 | Okuda et al. | |
| 6,916,398 B2 | 7/2005 | Chen et al. | |
| 6,955,725 B2 | 10/2005 | Dando | |
| 6,966,936 B2 | 11/2005 | Yamasaki et al. | |
| 6,991,684 B2 | 1/2006 | Kannan et al. | |
| 7,022,184 B2 | 4/2006 | Van Wijck et al. | |
| 7,086,410 B2 | 8/2006 | Chouno et al. | |
| 7,153,396 B2 | 12/2006 | Genser et al. | |
| 7,238,294 B2 | 7/2007 | Koops et al. | |
| 7,311,947 B2 | 12/2007 | Dando et al. | |
| 7,371,332 B2 | 5/2008 | Larson et al. | |
| 2001/0001952 A1 | 5/2001 | Nishizawa et al. | |
| 2001/0010309 A1 | 8/2001 | Van Bilsen | |
| 2001/0011526 A1 | 8/2001 | Doering et al. | |
| 2001/0012697 A1 | 8/2001 | Mikata | |
| 2001/0020447 A1 | 9/2001 | Murugesh et al. | |
| 2001/0024387 A1 | 9/2001 | Raaijmakers et al. | |
| 2001/0029892 A1 | 10/2001 | Cook et al. | |
| 2001/0045187 A1 | 11/2001 | Uhlenbrock | |
| 2001/0050267 A1 | 12/2001 | Hwang et al. | |
| 2001/0054484 A1 | 12/2001 | Komino | |
| 2002/0000202 A1 * | 1/2002 | Yuda et al. ............ 118/723 ER | |
| 2002/0007790 A1 | 1/2002 | Park | |
| 2002/0016044 A1 | 2/2002 | Dreybrodt et al. | |
| 2002/0020353 A1 | 2/2002 | Redemann et al. | |
| 2002/0020498 A1 * | 2/2002 | Ohmi et al. ................ 156/345 | |
| 2002/0042205 A1 | 4/2002 | McMillin et al. | |
| 2002/0043216 A1 | 4/2002 | Hwang et al. | |
| 2002/0052097 A1 | 5/2002 | Park | |
| 2002/0073924 A1 | 6/2002 | Chiang et al. | |
| 2002/0076490 A1 | 6/2002 | Chiang et al. | |
| 2002/0076507 A1 | 6/2002 | Chiang et al. | |
| 2002/0076508 A1 | 6/2002 | Chiang et al. | |
| 2002/0088547 A1 | 7/2002 | Tomoyasu et al. | |
| 2002/0094689 A1 | 7/2002 | Park | |
| 2002/0100418 A1 | 8/2002 | Sandhu et al. | |
| 2002/0104481 A1 | 8/2002 | Chiang et al. | |
| 2002/0108714 A1 | 8/2002 | Doering et al. | |
| 2002/0110991 A1 | 8/2002 | Li | |
| 2002/0127745 A1 | 9/2002 | Lu et al. | |
| 2002/0129768 A1 | 9/2002 | Carpernter et al. | |
| 2002/0132374 A1 | 9/2002 | Basceri et al. | |
| 2002/0144655 A1 | 10/2002 | Chiang et al. | |
| 2002/0146512 A1 | 10/2002 | Rossman | |
| 2002/0162506 A1 | 11/2002 | Sneh et al. | |
| 2002/0164420 A1 | 11/2002 | Derderian et al. | |
| 2002/0185067 A1 | 12/2002 | Upham | |
| 2002/0192369 A1 | 12/2002 | Morimoto et al. | |
| 2002/0195056 A1 | 12/2002 | Sandhu et al. | |
| 2002/0195145 A1 | 12/2002 | Lowery et al. | |
| 2002/0195201 A1 | 12/2002 | Beer | |
| 2002/0197402 A1 | 12/2002 | Chiang et al. | |
| 2003/0000473 A1 | 1/2003 | Chae et al. | |
| 2003/0003697 A1 | 1/2003 | Agarwal et al. | |
| 2003/0003730 A1 | 1/2003 | Li | |
| 2003/0013320 A1 | 1/2003 | Kim et al. | |
| 2003/0023338 A1 | 1/2003 | Chin et al. | |
| 2003/0024477 A1 | 2/2003 | Okuda et al. | |
| 2003/0027428 A1 | 2/2003 | Ng et al. | |
| 2003/0027431 A1 | 2/2003 | Sneh et al. | |
| 2003/0031794 A1 * | 2/2003 | Tada et al. ............ 427/255.391 | |
| 2003/0037729 A1 | 2/2003 | DeDontney et al. | |
| 2003/0049372 A1 | 3/2003 | Cook et al. | |
| 2003/0060030 A1 | 3/2003 | Lee et al. | |
| 2003/0066483 A1 | 4/2003 | Lee et al. | |
| 2003/0070609 A1 | 4/2003 | Campbell et al. | |
| 2003/0070617 A1 | 4/2003 | Kim et al. | |
| 2003/0070618 A1 | 4/2003 | Campbell et al. | |
| 2003/0075273 A1 | 4/2003 | Kilpela et al. | |
| 2003/0079686 A1 | 5/2003 | Chen et al. | |
| 2003/0090676 A1 | 5/2003 | Goebel et al. | |
| 2003/0094903 A1 | 5/2003 | Tao et al. | |
| 2003/0098372 A1 | 5/2003 | Kim | |
| 2003/0098419 A1 | 5/2003 | Ji et al. | |
| 2003/0106490 A1 | 6/2003 | Jallepally et al. | |
| 2003/0121608 A1 | 7/2003 | Chen et al. | |
| 2003/0159780 A1 | 8/2003 | Carpenter et al. | |
| 2003/0185979 A1 | 10/2003 | Nelson | |
| 2003/0192645 A1 | 10/2003 | Liu | |
| 2003/0194862 A1 | 10/2003 | Mardian et al. | |
| 2003/0200926 A1 | 10/2003 | Dando et al. | |
| 2003/0203109 A1 | 10/2003 | Dando et al. | |
| 2003/0213435 A1 | 11/2003 | Okuda et al. | |
| 2003/0232892 A1 | 12/2003 | Guerra-Santos et al. | |
| 2004/0000270 A1 | 1/2004 | Carpenter et al. | |
| 2004/0003777 A1 | 1/2004 | Carpenter et al. | |
| 2004/0007188 A1 | 1/2004 | Burkhart et al. | |
| 2004/0025786 A1 | 2/2004 | Kontani et al. | |
| 2004/0035358 A1 | 2/2004 | Basceri et al. | |
| 2004/0040502 A1 | 3/2004 | Basceri et al. | |
| 2004/0040503 A1 | 3/2004 | Basceri et al. | |
| 2004/0083959 A1 | 5/2004 | Carpenter et al. | |
| 2004/0083960 A1 | 5/2004 | Dando | |
| 2004/0083961 A1 | 5/2004 | Basceri | |
| 2004/0089240 A1 | 5/2004 | Dando et al. | |
| 2004/0094095 A1 | 5/2004 | Huang et al. | |
| 2004/0099377 A1 | 5/2004 | Newton et al. | |
| 2004/0124131 A1 | 7/2004 | Aitchison et al. | |
| 2004/0154538 A1 | 8/2004 | Carpenter et al. | |
| 2004/0226507 A1 | 11/2004 | Carpenter et al. | |
| 2004/0226516 A1 | 11/2004 | Daniel et al. | |
| 2004/0238123 A1 | 12/2004 | Becknell et al. | |
| 2005/0016956 A1 | 1/2005 | Liu et al. | |

| | | | | | | |
|---|---|---|---|---|---|---|
| 2005/0016984 | A1 | 1/2005 | Dando | WO | WO-99/06610 A1 | 2/1999 |
| 2005/0022739 | A1 | 2/2005 | Carpenter et al. | WO | WO-00/40772 A1 | 7/2000 |
| 2005/0028734 | A1 | 2/2005 | Carpenter et al. | WO | WO-00/63952 A1 | 10/2000 |
| 2005/0039680 | A1 | 2/2005 | Beaman et al. | WO | WO-00/65649 A1 | 11/2000 |
| 2005/0039686 | A1 | 2/2005 | Zheng et al. | WO | WO-00/79019 A1 | 12/2000 |
| 2005/0045100 | A1 | 3/2005 | Derderian | WO | WO-01/32966 | 5/2001 |
| 2005/0045102 | A1 | 3/2005 | Zheng et al. | WO | WO-01/46490 A1 | 6/2001 |
| 2005/0048742 | A1 | 3/2005 | Dip et al. | WO | WO-02/45871 A1 | 6/2002 |
| 2005/0059261 | A1 | 3/2005 | Basceri et al. | WO | WO-02/48427 A1 | 6/2002 |
| 2005/0061243 | A1 | 3/2005 | Sarigiannis et al. | WO | WO-02/073329 A2 | 9/2002 |
| 2005/0081786 | A1 | 4/2005 | Kubista et al. | WO | WO-02/073660 A2 | 9/2002 |
| 2005/0087130 | A1 | 4/2005 | Derderian | WO | WO-02/081771 A2 | 10/2002 |
| 2005/0087132 | A1 | 4/2005 | Dickey et al. | WO | WO-02/095807 A2 | 11/2002 |
| 2005/0087302 | A1 | 4/2005 | Mardian et al. | WO | WO-03/008662 A2 | 1/2003 |
| 2005/0103275 | A1 | 5/2005 | Sasaki et al. | WO | WO-03/016587 | 2/2003 |
| 2005/0217582 | A1* | 10/2005 | Kim et al. ............... 118/723 E | WO | WO-03/016587 A1 | 2/2003 |
| 2006/0121689 | A1 | 6/2006 | Basceri et al. | WO | WO-03/028069 A2 | 4/2003 |
| 2006/0198955 | A1 | 9/2006 | Zheng et al. | WO | WO-03/033762 A1 | 4/2003 |
| 2006/0204649 | A1 | 9/2006 | Beaman et al. | WO | WO-03/035927 A2 | 5/2003 |
| 2006/0205187 | A1 | 9/2006 | Zheng et al. | WO | WO-03/052807 A1 | 6/2003 |
| 2006/0213440 | A1 | 9/2006 | Zheng et al. | | | |
| 2006/0237138 | A1 | 10/2006 | Qin | | | |

FOREIGN PATENT DOCUMENTS

| | | |
|---|---|---|
| DE | 198 51 824 A1 | 5/2000 |
| EP | 140246 | 5/1985 |
| EP | 740490 | 10/1996 |
| EP | 1 167 569 A1 | 1/2002 |
| GB | 1065762 | 4/1967 |
| GB | 1469230 | 4/1977 |
| JP | 55108944 | 8/1980 |
| JP | 60054443 | 3/1985 |
| JP | 61292894 | 12/1986 |
| JP | 62235728 | 10/1987 |
| JP | 62263629 | 11/1987 |
| JP | 63-020490 | 1/1988 |
| JP | 63-111177 | 5/1988 |
| JP | 63234198 | 9/1988 |
| JP | 63-256460 A | 10/1988 |
| JP | 63259067 | 10/1988 |
| JP | 64-81311 | 3/1989 |
| JP | 1-273991 A | 11/1989 |
| JP | 02208925 | 8/1990 |
| JP | 2306591 | 12/1990 |
| JP | 03174717 | 7/1991 |
| JP | 04064225 | 2/1992 |
| JP | 04069933 | 3/1992 |
| JP | 4-100533 A | 4/1992 |
| JP | 4-213818 A | 8/1992 |
| JP | 05024975 | 2/1993 |
| JP | 05102025 | 4/1993 |
| JP | 6-151558 A | 5/1994 |
| JP | 06172979 | 6/1994 |
| JP | 06-201539 | 7/1994 |
| JP | 06202372 | 7/1994 |
| JP | 06-342785 | 12/1994 |
| JP | 6-342785 A | 12/1994 |
| JP | 7263144 | 10/1995 |
| JP | 8-34678 A | 2/1996 |
| JP | 08179307 | 7/1996 |
| JP | 9-82650 A | 3/1997 |
| JP | 10008255 | 1/1998 |
| JP | 10200091 | 7/1998 |
| JP | 10-223719 A | 8/1998 |
| JP | 11-172438 A | 6/1999 |
| JP | 2001-82682 A | 3/2001 |
| JP | 2001-261375 A | 9/2001 |
| JP | 2002-164336 A | 6/2002 |
| JP | 2001-254181 A | 9/2002 |
| KR | 2005112371 | 11/2005 |
| SU | 598630 | 3/1978 |
| WO | WO-98/37258 A1 | 8/1998 |

OTHER PUBLICATIONS

U.S. Appl. No. 11/027,825, filed Dec. 29, 2004, Derderian et al.
U.S. Appl. No. 10/933,604, filed Sep. 2, 2004, Carpenter et al.
U.S. Appl. No. 10/839,316, filed May 5, 2004, Saragiannis et al.
U.S. Appl. No. 10/814,573, filed Mar. 31, 2004, Gealy et al.
U.S. Appl. No. 11/043,629, filed Jan. 25, 2005, Rueger et al.
U.S. Appl. No. 11/018,142, filed Dec. 20, 2004, Rueger et al.
U.S. Appl. No. 10/840,571, filed May 6, 2004, Dando et al.
U.S. Appl. No. 10/859,883, filed Jun. 2, 2004, Miller et al.
U.S. Appl. No. 10/733,523, filed Oct. 10, 2003, Beaman et al.
U.S. Appl. No. 11/027,809, filed Dec. 29, 2004, Carpenter et al.
U.S. Appl. No. 09/651,037, filed Aug. 30, 2000, Mardian.
U.S. Appl. No. 10/365,085, filed Feb. 11, 2003, Carpenter et al.
U.S. Appl. No. 10/665,908, filed Sep. 18, 2003, Sarigiannis et al.
Integrated Process Systems Ltd., "ALD & CVD", 2 pages, retrieved from the Internet on Dec. 11, 2001, <http://www.ips-tech.com/eng/pro-p2-2.htm>.
Deublin Company, "Rotating Unions", 1 page, retrieved from the Internet on Feb. 4, 2002, <http://www.com/products/rotatingunions.htm>.
Cameron, I., "Atomic Layer Deposition Chamber Works at Low Temperatures", 2 pages, Electronic Times, Jul. 19, 2001, <http://www.electronictimes.com/story/OEG20010719S0042>.
Cutting Edge Optronics, 600W QCW Laser Diode Array, Part No. ARR48P600, 2 pages, Oct. 2001, <www.ceolaser.com>.
Henning, A.K., et al., "Microfluidic MEMS for Semiconductor Processing," IEEE Trans. Components, Packaging, and Manufacturing Technology B21, pp. 329-337, 1998.
Fitch, J.S., et al., "Pressure-Based Mass-Flow Control Using Thermopneumatically-Actuated Microvalves," Proceedings, Sensors and Actuators Workshop, pp. 162-165 (Transducers Research Foundation, Cleveland, OH, 1998).
Henning, A.K., "Liquid and gas-liquid phase behavior in the thermopneumatically actuated microvalves," Proceedings, Micro Fluidic Devices and Systems (SPIE, Bellingham, WA, 1998; A.B. Frazier and C.H. Ahn, eds.), vol. 3515, pp. 53-63.
Henning, A.K., et al., "Performance of MEMS-Based Gas Distribution and Control Systems for Semiconductor Processing", 8 pages, Proceedings, SEMICON West Workshop on Gas Distribution (SEMI, Mountain View, CA, 1998).
Maillefer, D., et al., "A High-Performance Silicon Micropump for Disposable Drug Delivery Systems," pp. 413-417, IEEE, 2001.
Henning, A.K., et al., "A thermopneumatically actuated microvalve for liquid expansion and proportional control", Proceedings, Transducers '97: 1997 International Solid State Sensors and Actuators Conference, pp. 825-828.
University of California, Berkeley, University Extension, "Atomic Layer Deposition," 5 pages, Sep. 24-25, 2001, <http://www.unex.berkeley.edu/eng/br225/1-1.html>.

Engelke, F., et al., "Determination of Phenylthiohydantoin-Amino Acids by Two-Step Laser Sesorption/Multiphoton Ionization," Analytical Chemistry, vol. 59, No. 6, pp. 909-912, Mar. 15, 1987, The American Chemical Society.

Cowin, J.P., et al., "Measurement of Fast Desorption Kinetics of D2 From Tungsten By Laser Induced Thermal Desorption," Surface Science, vol. 78, pp. 545-564, 1978, North-Holland Publishing Company.

Ready, J.F., "Effects Due to Absorption of Laser Radiation," Journal of Applied Physics, vol. 36, No. 2, pp. 462-468, Feb. 1965, Journal of Applied Physics, American Institute of Physics.

Zare, R.N., et al. "Mass Spectrometry of Molecular Adsorbates Using Laser Desorption/Laser Multiphoton Ionization," Bulletin of the Chemical Society of Japan, vol. 61, No. 1, pp. 87-92, Jan. 1988.

Tokyo Electron Limited, Plasma Process System, Trias SPA, 1 page, retrieved from the Internet on Oct. 16, 2004, <http://www.tel.com/eng/products/spe/sdtriasspa.htm>.

Olsson, A., "Valve-less Diffuser Micropumps", ISSN 0281-2878, 66 pages, 1998.

Bardell, R.L., et al., "Designing High-Performance Micro-Pumps Based on No-Moving-Parts Valves", DSC-vol. 62/HTD-vol. 354, Microelectromechanical Systems (MEMS) ASME 1997, pp. 47-53.

Henning, A.K., et al., "Performance of MEMS-Based Gas Distribution and Control Systems for Semiconductor Processing," Proceedings, Micromachined Devices and Components (SPIE, Bellingham, WA, 1998; P.J. French and K. Chau, eds.), vol. 3514, pp. 159-170.

Henning, A.K. et al., "Contamination Reduction Using MEMS-Based, High-Precision Mass Flow Controllers," Proceedings, SEMICON West Symposium on Contamination Free Manufacturing for Semiconductor Processing (SEMI, Mountain View, CA, 1998), pp. 1-11.

Henning, A.K., "Microfluidic MEMS," Proceedings, IEEE Aerospace Conference, Paper 4.906 (IEEE Press, Piscataway, NJ, 1998), 16 pages.

Peters, L., "Thermal Processing's Tool of Choice: Single-Wafer RTP or Fast Ramp Batch?" Semiconductor International, Apr. 1, 1998, 8 pages, <http://www.e-incite.net/semiconductor/index.asp?alyout+article&articleid=CA163937>.

The University of Adelaide, Australia, Department of Chemistry, "Spectroscopy", 2 pages, retrieved from the Internet on Feb. 9, 2002, <http://www.chemistry.adelaide.edu.au/external/Soc-Rel/Content/spectros.htm>.

Deublin Company, "Sealing," 2 pages, retrieved from the Internet on Feb. 4, 2002, <http://www.deublin.com/products/sealing.htm>.

Deublin Company, "Precision Rotating Connections for Water, Steam, Air, Hydraulic, Vacuum, Coolant and Hot Oil Service," 1 page, retrieved from the Internet on Feb. 4, 2002, <http://www.deublin.com>.

Integrated Process Systems Ltd., "Nano-ALD", 2 pages, retrieved from the Internet on Dec. 11, 2001, <http://www.ips-tech.com/eng/pro-p2.htm>.

Integrated Process Systems Ltd., "Welcome to IPS Ltd.", 1 page, retrieved from the Internet on Dec. 11, 2001, <http://www.ips-tech.com/eng/main.htm>.

Takahashi, K et al., "Process Integration of 3D Chip Stack with Vertical Interconnection," pp. 601-609, 2004 Electronic Components and Technology Conference, IEEE, Jun. 2004.

Aera Corporation, "Fundamentals of Mass Flow Control," 1 page, retrieved from the Internet on Mar. 6, 2003, <http://www.aeramfc.com/funda.shtml>.

EMCO Flow Systems, "Mach One Mass Flow Controllers", 1 page, retrieved from the Internet on Nov. 7, 2003, <http://emcoflow.com/mach-one.htm>.

EMCO Flow Systems, Mach One Mass Flow Controller Product Brochure, 6 pages, retrieved from the Internet on Nov. 7, 2003, <http://www.emcoflow.com/literature/brochures_product_sheets/mach_one/mach_one_brochure_2_01.pdf>.

SemiZone, EMCO Flow Systems Granted Patent for the Mach One Mass Flow Controller for the Semiconductor Industry (Jun. 28, 2001), 2 pages, retrieved from the Internet on Nov. 7, 2003, <http://www.semizone.com/news/item?news_item_id=100223>.

MKS Instruments, Data Sheet, Downstream Plasma Source, Type AX7610, 4 pages, Dec. 2002, <http://www.mksinst.com/docs/UR/ASTEXax7610DS.pdf>.

MKS Instruments, ASTeX® Microwave Plasma Sources and Subsystems, 1 page, retrieved from the Internet on Nov. 19, 2004, <http://www.mksinst.com/PRG2.html>.

"Selective Deposition with 'Dry' Vaporizable Lift-Off Mask," IBM Technical Disclosure Bulletin, vol. 35, Issue 1A, pp. 75-76, Jun. 1, 1992.

Eguchi, K. et al., "Composition Self-Matching Phenomena in Chemical Vapor Deposition of $(Ba,Sr)TiO_3$ Thin Films," Electrochemical Society Proceedings vol. 98-3, pp. 179-189.

Kawahara, T. et al., "Step Coverage and Electrical Properties of $(Ba,Sr)TiO_3$ Films Prepared by Liquid Source Chemical Vapor Deposition," Electrochemical Society Proceedings, vol. 98-3, pp. 190-195.

Wright, D.R., et al., "Manufacturing issues of electrostatic chucks," J. Vac. Sci. Technol. B 13(4), pp. 1910-1916, Jul./Aug. 1995, American Vacuum Society.

* cited by examiner

APPARATUS AND METHODS FOR MANUFACTURING MICROFEATURES ON WORKPIECES USING PLASMA VAPOR PROCESSES

TECHNICAL FIELD

The present invention relates to fabricating microfeatures on workpieces using plasma vapor processes to deposit and/or remove materials from a workpiece.

BACKGROUND

Thin film deposition techniques are widely used to build interconnects, plugs, gates, capacitors, transistors and other microfeatures in the manufacturing of microelectronic devices. Thin film deposition techniques are continually improved to meet the ever increasing demands of the industry because microfeature sizes are constantly decreasing and the number of microfeature layers is constantly increasing. As a result, the density of components and the aspect ratios of depressions (e.g., the ratio of the depth to the size of the opening) are increasing. Thin film deposition techniques accordingly strive to produce highly uniform conformal layers that cover the sidewalls, bottoms, and corners in deep depressions that have very small openings.

One widely used thin film deposition technique is chemical vapor deposition (CVD). In a CVD system, one or more reactive precursors are mixed in a gas or vapor state and then the precursor mixture is presented to the surface of the workpiece. The surface of the workpiece catalyzes a reaction between the precursors to form a solid, thin film at the workpiece surface. A common way to catalyze the reaction at the surface of the workpiece is to heat the workpiece to a temperature that causes the reaction. CVD processes are routinely employed in many stages of manufacturing microelectronic components.

Atomic layer deposition (ALD) is another thin film deposition technique that is gaining prominence in manufacturing microfeatures on workpieces. FIGS. 1A and 1B schematically illustrate the basic operation of ALD processes. Referring to FIG. 1A, a layer of gas molecules A coats the surface of a workpiece W. The layer of A molecules is formed by exposing the workpiece W to a precursor gas containing A molecules and then purging the chamber with a purge gas to remove excess A molecules. This process can form a monolayer of A molecules on the surface of the workpiece W because the A molecules at the surface are held in place during the purge cycle by physical adsorption forces at moderate temperatures or chemisorption forces at higher temperatures. The layer of A molecules is then exposed to another precursor gas containing B molecules. The A molecules react with the B molecules to form an extremely thin layer of solid material C on the workpiece W. Such thin layers are referred to herein as nanolayers because they are typically less than 1 nm and usually less than 2 Å. For example, each cycle may form a layer having a thickness of approximately 0.5-1 Å. The chamber is then purged again with a purge gas to remove excess B molecules.

Another type of CVD process is plasma CVD in which energy is added to the gases inside the reaction chamber to form a plasma. U.S. Pat. No. 6,347,602 discloses several types of plasma CVD reactors. FIG. 2 schematically illustrates a conventional plasma processing system including a processing vessel 2 including a microwave transmitting window 4. The plasma processing system further includes a microwave generator 6 having a rectangular wave guide 8 and a disk-shaped antenna 10. The microwaves radiated by the antenna 10 propagate through the window 4 and into the processing vessel 2. The processing system 10 further includes a gas distributor 12 having an annular chamber 14 and a plurality of openings 16 facing radially inwardly into the processing vessel 2. The annular chamber 14 of the gas distributor 12 is not open to the window 4 such that the microwaves do not enter the chamber 14. In operation, a gas G flows radially inwardly through the openings 16 as the microwaves pass through the window 4 to form a plasma by electron cyclotron resonance. The plasma can be used to deposit or etch material on the workpiece W.

Although plasma CVD processes are useful for several applications, such as gate hardening, they may produce non-uniform films or features on a workpiece. For example, the plasma is concentrated in peripheral zones $P_1$ and $P_2$ near the openings 16 of the gas distributor 12. The central region of the processing vessel 2 along the center line $C_L$ accordingly has less plasma than the peripheral zones $P_1$ and $P_2$. The non-uniform concentration of the plasma proximate to the gas distributor 12 typically results in a non-uniform coating or non-uniform etching across the workpiece W. Such non-uniformities limit the utility of plasma vapor processing for forming very small microfeatures. Therefore, plasma vapor processing for depositing or etching materials on workpieces W may introduce unacceptable non-uniformities in many current microfeature devices.

DETAILED DESCRIPTION

A. Overview

Figure 1A:
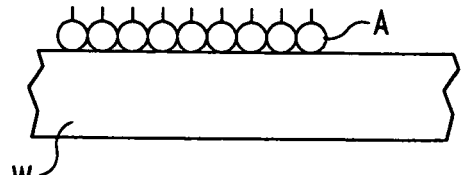
FIGS. 1A and 1B are schematic cross-sectional views of stages in an ALD process in accordance with the prior art.
Figure 1B:
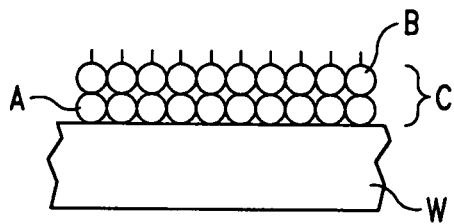
Figure 2:
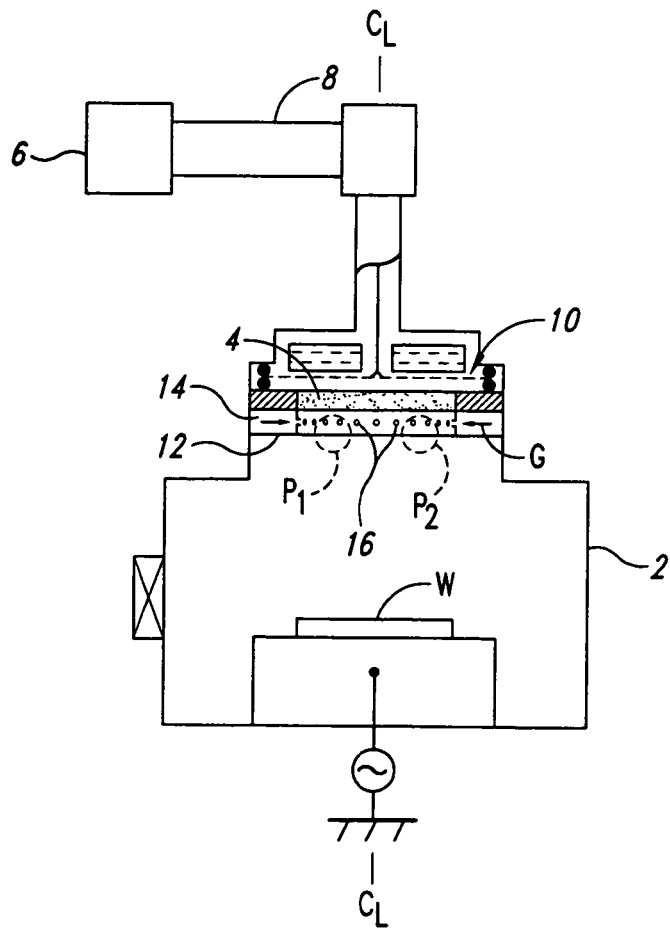
FIG. 2 is a schematic cross-sectional view of a plasma vapor deposition system in accordance with the prior art.

Several embodiments of the present invention are directed toward microfeature workpiece processing systems and methods for depositing materials onto microfeature workpieces. Many specific details of the invention are described below with reference to systems for depositing materials onto microfeature workpieces in CVD or ALD processes, but they can also be used in etching applications or other processes. The term "microfeature workpiece" is used throughout to include substrates upon which and/or in which microelectronic devices, micromechanical devices, data storage elements, read/write components, and other features are fabricated. For example, microfeature workpieces can be semiconductor wafers (e.g., silicon or gallium arsenide wafers), glass substrates, insulative substrates, and many other types of materials. The microfeature workpieces typically have submicron features with dimensions of a few nanometers or greater. Furthermore, the term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Several embodiments in accordance with the invention are set forth in FIGS. 3-10 and the following text to provide a thorough understanding of particular embodiments of the invention. A person skilled in the art will understand, however, that the invention may have additional embodiments, or that the invention may be practiced without several of the details of the embodiments shown in FIGS. 3-10.

One aspect of the invention is directed toward a reactor for processing a microfeature workpiece using a plasma. In one embodiment, the reactor comprises an energy source, a plasma unit positioned relative to the energy source, and a processing vessel connected to the plasma unit. The energy source has a generator that produces a plasma energy and a transmitter to transmit the plasma energy. The plasma unit has a first portion or transmissive portion through which the plasma energy can propagate, a second portion or distributor portion having a plurality of outlets, and a chamber in fluid communication with the plurality of outlets. The chamber is generally between and/or within the first and second portions. The plasma energy can pass through at least the first portion and into the chamber to create a plasma in the chamber. The second portion can also be transmissive to the plasma energy from the transmitter, but in some embodiments the second portion can be opaque to the energy from the transmitter. The processing vessel includes a workpiece holder across from the outlets of the second portion of the plasma unit. One aspect of an embodiment of the reactor is that the workpiece holder is superimposed under at least some of the outlets of the plasma unit so that the plasma is dispensed to the workpiece in a desired distribution.

In another embodiment of the invention, the reactor comprises an energy source having a generator that produces a plasma energy and a transmitter to transmit the plasma energy. The reactor in this embodiment can further include a processing vessel and a plasma unit. The processing vessel can have a workpiece holder having a peripheral region and an inner region. The plasma unit can have a chamber in which the plasma is generated and an outlet in fluid communication with the chamber. The outlet is configured to distribute the plasma from a location directly over the inner region of the workpiece holder.

Another aspect of the invention is a plasma unit for distributing a plasma in a reactor. In one embodiment, the plasma unit comprises a body composed at least in part of a material through which the plasma energy can propagate. The plasma unit further includes a chamber having an inlet for receiving the gas. The chamber is configured to be irradiated by the plasma energy propagating through the body. The plasma unit can further include a plurality of outlets in fluid communication with the chamber. The outlets are arranged to distribute the plasma directly over a workpiece. The body can be composed of several different materials. In one embodiment, the body is a quartz panel having an upper portion and a lower portion. The chamber can be a cavity in the quartz panel between and/or within the upper and lower portions, and the outlets can be arranged along the lower portion of the panel in fluid communication with the chamber.

Still another aspect of the invention is directed toward a method of processing a microfeature workpiece. In one embodiment, the method comprises positioning a workpiece on a workpiece holder in a reactor for plasma vapor processing. The method continues by producing a plasma and delivering at least a portion of the plasma through an opening over the workpiece holder.

In another embodiment of a method for processing a microfeature workpiece, the workpiece is positioned on a workpiece holder in a reactor for plasma vapor processing. This embodiment of the method includes producing a plasma in a panel or other body having a first portion and a second portion. The plasma can be produced by injecting a gas into a chamber between and/or within the first and second portions while transmitting a plasma energy through at least the first portion of the body. This embodiment of the method further includes delivering at least a portion of the plasma through an opening in the second portion of the panel. For example, the opening can be positioned directly over the workpiece holder such that the opening is superimposed over a workpiece during operation.

For ease of understanding, the following discussion is divided into two areas of emphasis. The first section discusses aspects of plasma vapor processing systems in accordance with the selected embodiments of the invention. The second section outlines methods in accordance with other aspects of the invention.

Figure 3:
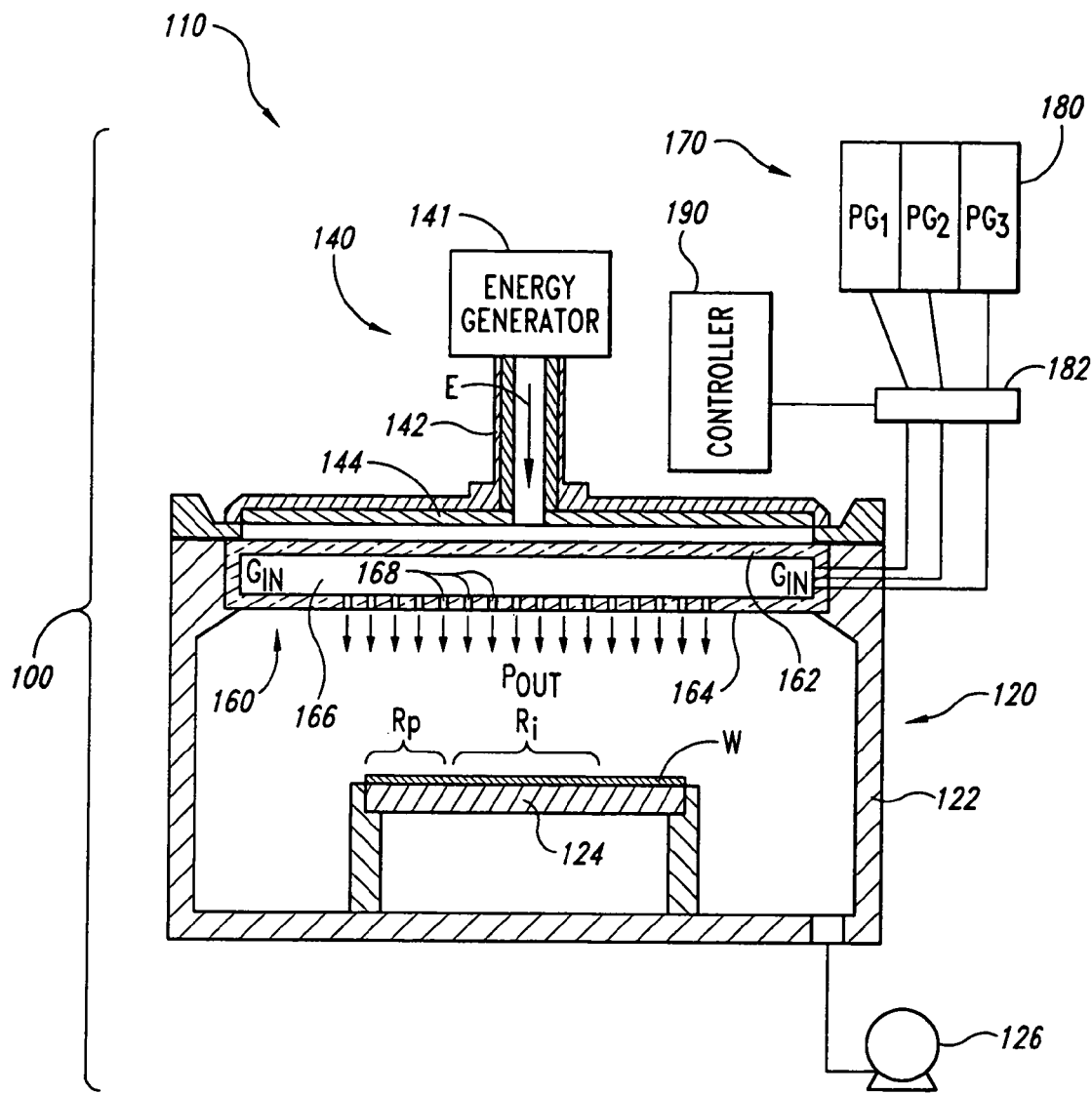
FIG. 3 is a schematic cross-sectional view of a plasma vapor processing system in accordance with an embodiment of the invention.

B. Embodiments of Plasma Vapor Processing Systems for Fabricating Microfeature on Workpieces FIG. 3 is a schematic cross-sectional view of a plasma vapor processing system 100 for depositing or etching a material on a microfeature workpiece W. In this embodiment, the processing system 100 includes a reactor 110 having a processing vessel 120, an energy system 140 for generating an excitation or plasma energy, and a plasma unit 160 between the processing vessel 120 and the energy system 140. The plasma unit 160 is configured to contain and distribute a plasma. Unlike processing systems in accordance with the prior art, the processing system 100 is expected to provide better control of the distribution of plasma across a workpiece. For example, the plasma unit 160 provides an antechamber in which a plasma is produced remotely from the workpiece W. The plasma unit 160 also provides a distributor to dispense the plasma over the workpiece in a desired distribution.

Referring still to the embodiment of the processing system 100 shown in FIG. 3, the processing vessel 120 can include a low pressure chamber or container 122 and a workpiece holder 124 in the low pressure container 122. The low pressure container 122 is coupled to a vacuum pump 126 to produce a low pressure environment. The workpiece holder 124 can be a heated chuck or other device that holds the workpiece W.

The energy system 140 provides a plasma energy E for producing a plasma from one or more process gases. The energy system 140 can include a generator 141, an energy guide 142 coupled to the generator 141, and an antenna 144 coupled to the energy guide 142. The generator 141 can be a microwave generator. For example, the generator 141 can produce microwave energy at 2.45 GHz or another suitable frequency for generating a plasma from the process gas(es). The energy guide 142 can be a wave guide that transmits the plasma energy E from the generator 140 to the antenna 144. The plasma energy E is transmitted from the antenna 144 to the plasma unit 160 to generate a plasma within the plasma unit 160.

The plasma unit 160 functions as a plasma or gas distributor between the workpiece holder 124 and the energy system 140. In one embodiment, the plasma unit 160 includes a first portion 162 (e.g., a transmitter portion), a second portion 164 (e.g., a distributor or dispensing portion), and a cavity or chamber 166. The chamber 166 can be housed between and/or within the first and second portions 162 and 164. The plasma unit 160 can further include one or more ports or outlets 168 in fluid communication with the chamber 166. The outlets 168 are generally arranged relative to the workpiece holder 124 to provide a controlled distribution of plasma and/or another process gas to the workpiece W.

The first and second portions 162 and 164 can be integral with one another. For example, the first portion 162 can be a transmitter portion of an enclosed cell and the second portion 164 can be a distributor portion of the enclosed cell. The first portion 162 is generally transmissive to the plasma energy E. The second portion 164 can also be transmissive to the plasma energy E, but the second portion 164 can be opaque or substantially non-transmissive to the plasma energy E in other embodiments. The embodiment of the plasma unit 160 illustrated in FIG. 3 is a plate or body composed of a material that is transmissive to the plasma energy E and has a single large chamber 166 within the first and second portions 162 and 164. The chamber 166 can be a single circular cavity, annular cavity, square cavity, or another type of cavity with a suitable shape for a particular process. In other embodiments, the chamber 166 can have a plurality of separate channels or conduits arranged in a desired configuration. As explained in more detail below, an incoming gas $G_{in}$ is converted into a plasma in the chamber 166, and a flow of plasma $P_{out}$ issues from the outlets 168 toward the workpiece W.

The outlets 168 are arranged over and spaced apart from the workpiece holder 124 in a desired configuration to provide a controlled distribution of the plasma or other process gases to the workpiece W. In several embodiments, at least one outlet is superimposed over the workpiece holder 124 to be positioned directly over or across from the workpiece W. For example, a plurality of first outlets 168 can be superimposed over or across from an inner region $R_i$ relative to the workpiece W. Similarly, a second plurality of outlets 168 can be superimposed over or spaced across from a peripheral region $R_p$ relative to the workpiece W. The outlets 168 can be arranged in many different configurations according to the specific parameters of a particular process. For example, the outlets 168 can be arranged to provide a substantially uniform distribution of the plasma or other process gases across the workpiece W. Several different configurations of plasma units and outlets are described below with reference to FIGS. 4-9.

Referring still to FIG. 3, the processing system 100 can further include a gas supply 180 having a plurality of process gases, a valve unit 182 coupled to the gas supply 180 and the plasma unit 160, and a controller 190 operatively coupled to the valve unit 182. The gas supply 180 can include a first process gas $PG_1$, a second process gas $PG_2$, and a third process gas $PG_3$. The first and second process gases $PG_1$ and $PG_2$ can be precursors that react together in CVD or ALD processes to deposit a layer of material on the workpiece W. The third process gas $PG_3$ can be a purge gas for performing ALD or pulsed CVD processes. In an alternative application, the gas supply 180 can include process gases for etching or performing other processes on the workpiece W. The gas supply 180 can accordingly have one or more process gases that are selectively delivered to the plasma unit 180 through the valve unit 182 according to computer operable instructions contained in the controller 190.

The plasma vapor processing system 100 is expected to provide good control of the distribution of plasma and/or other process gases across the surface of the workpiece W. In operation, the controller 190 controls the valve unit 182 to provide a flow of incoming gases $G_{in}$ to perform CVD, ALD or etching processes using the process gases PG. As the incoming gases $G_{in}$ flow into the plasma unit, the plasma energy E propagates through the transmissive first portion 162 of the plasma unit 160 and into the chamber 166. The plasma energy E produces a plasma in the chamber 166 from one or more of the incoming process gases $G_{in}$. The outlets 168 in the second portion 164 of the plasma unit 160 direct the plasma $P_{out}$ to the workpiece W. The outlets 168, for example, can be superimposed over the inner region $R_i$ of the workpiece W to direct the plasma $P_{out}$ downward to the workpiece W. This embodiment of the system 100 is expected to provide better control over the thickness of the material either deposited on or removed from the workpiece W. In one particular embodiment, the outlets 168 can be arranged to provide a substantially uniform distribution of the plasma and/or process gases across the inner region $R_i$ and the peripheral region $R_p$ to provide a substantially uniform deposition or removal rate across the workpiece W.

C. Embodiments of Plasma Units for Plasma Vapor Processing Systems

Figure 4:
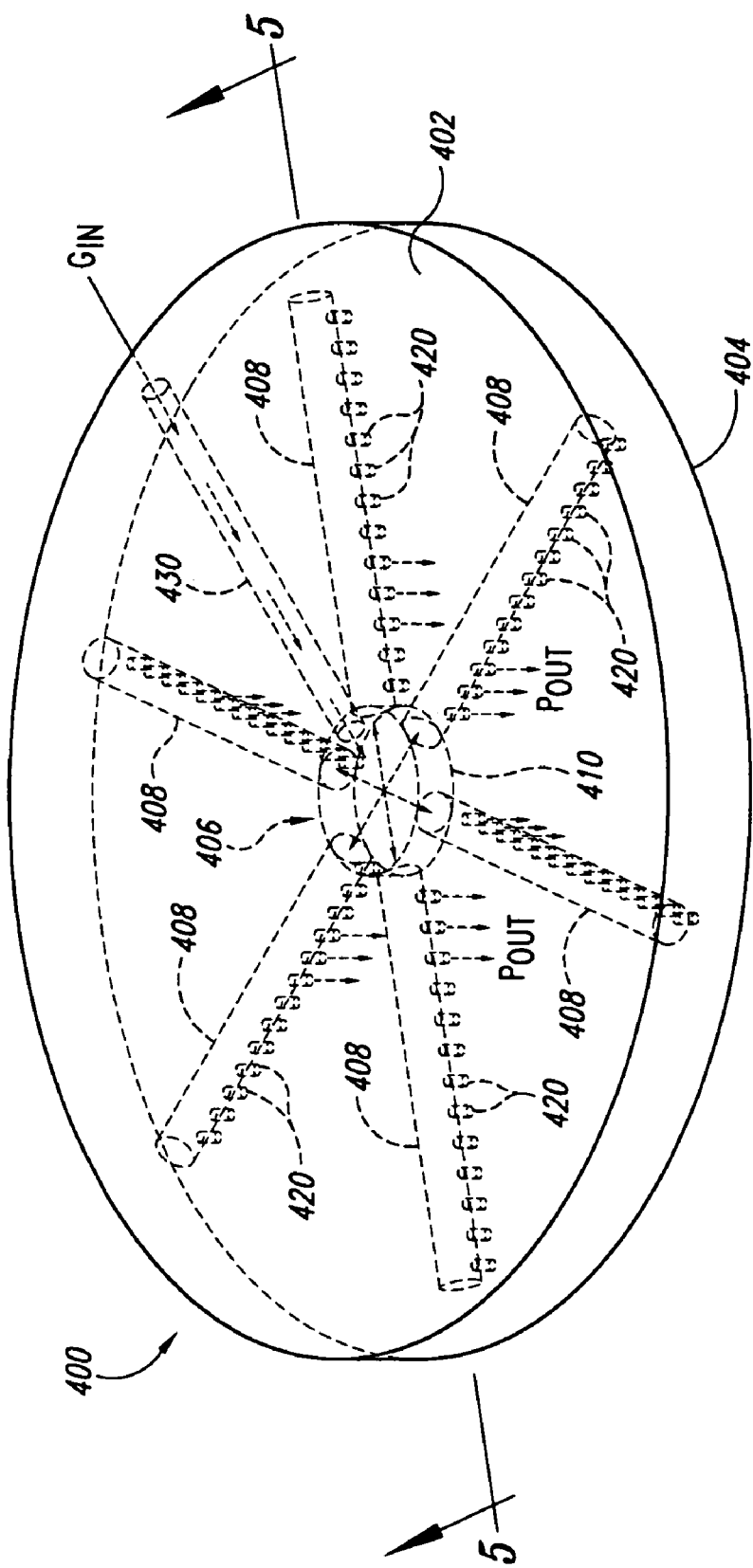
FIG. 4 is an isometric view of a plasma unit for a plasma vapor processing system in accordance with an embodiment of the invention.
Figure 5:
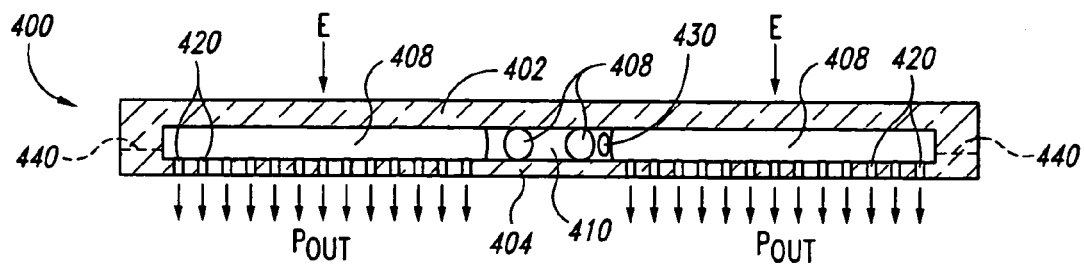
FIG. 5 is a cross-sectional view of the plasma unit of FIG. 4 taken along line 5-5.

FIG. 4 is an isometric view and FIG. 5 is a cross-sectional view along line 5-5 in FIG. 4 of a plasma unit 400 in accordance with an embodiment of the invention. The plasma unit 400 is a window having a high transmissivity to microwave energy or another suitable plasma energy E. The plasma unit 400 has a first portion 402 (e.g., top portion), a second portion 404 (e.g., bottom portion), and a chamber 406 with a plurality of discrete conduits 408 extending radially outwardly from a hub 410. The plasma unit 400 further includes a plurality of ports or outlets 420 in the second portion 404 and an inlet passage 430 (see FIG. 4). The outlets 420 are arranged along the conduits 408. The inlet passage 430 extends from the periphery of the plasma unit 400 into the hub 410.

The plasma unit 400 can be formed by drilling the conduits and the inlet passage radially inwardly from the peripheral edge of the plasma unit. The periphery of the plasma unit can then be capped to form the structure shown in FIGS. 4 and 5. In another embodiment, the first and second portions 402 and 404 can initially be discrete components connected together at an interface 440 (shown only in FIG. 5). The conduits 408 in this embodiment are etched or machined into the interior of the first and/or second portions 402 and 404, and then the first portion 402 is attached to the second portion 404 along the interface 440. In either embodiment, the outlets 420 are drilled and/or etched through the second portion 404 to be in fluid communication with the conduits 408.

The first and second portions 402 and 404 can be formed from a single panel or body of material that is transmissive to the plasma energy E. For example, the first and second portions 402 and 404 can be top and bottom portions of a quartz block. In other embodiments, only the first portion 402 may be transmissive to the plasma energy E and the second portion 404 may be composed of a different material. In a further embodiment, only the areas of the first portion 402 above the conduits 408 may be formed from a material that is transmissive to the plasma energy E. This embodiment may accordingly have a plurality of discrete windows extending over conduits 408 that have been formed in a block of different material.

Referring to FIG. 4, the inlet gas $G_{in}$ flows through the inlet 430 and into the hub 410. Referring to FIGS. 4 and 5 together, the gas then flows through the conduits 408 where it is excited by the plasma energy E to form a plasma. The plasma then flows out of the ports 420 in a desired distribution across the workpiece W.

Figure 6A:
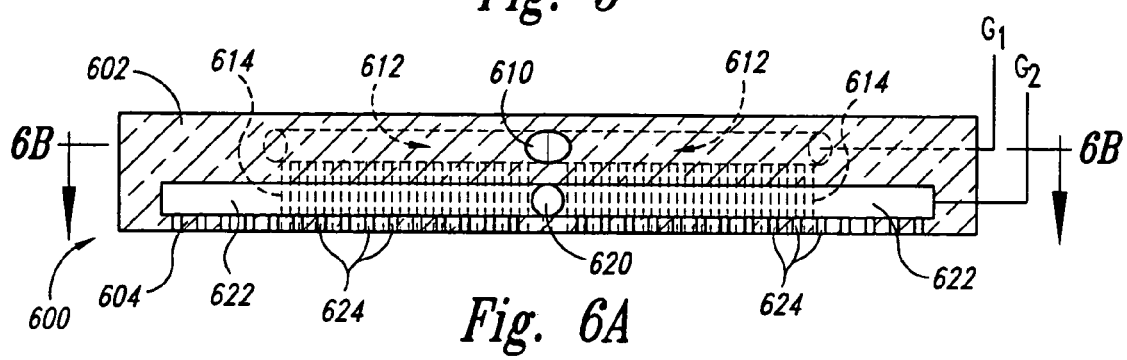
FIG. 6A is a schematic cross-sectional view and FIG. 6B is a top plan view of a plasma unit for use in a plasma vapor processing system in accordance with another embodiment of the invention.
Figure 6B:
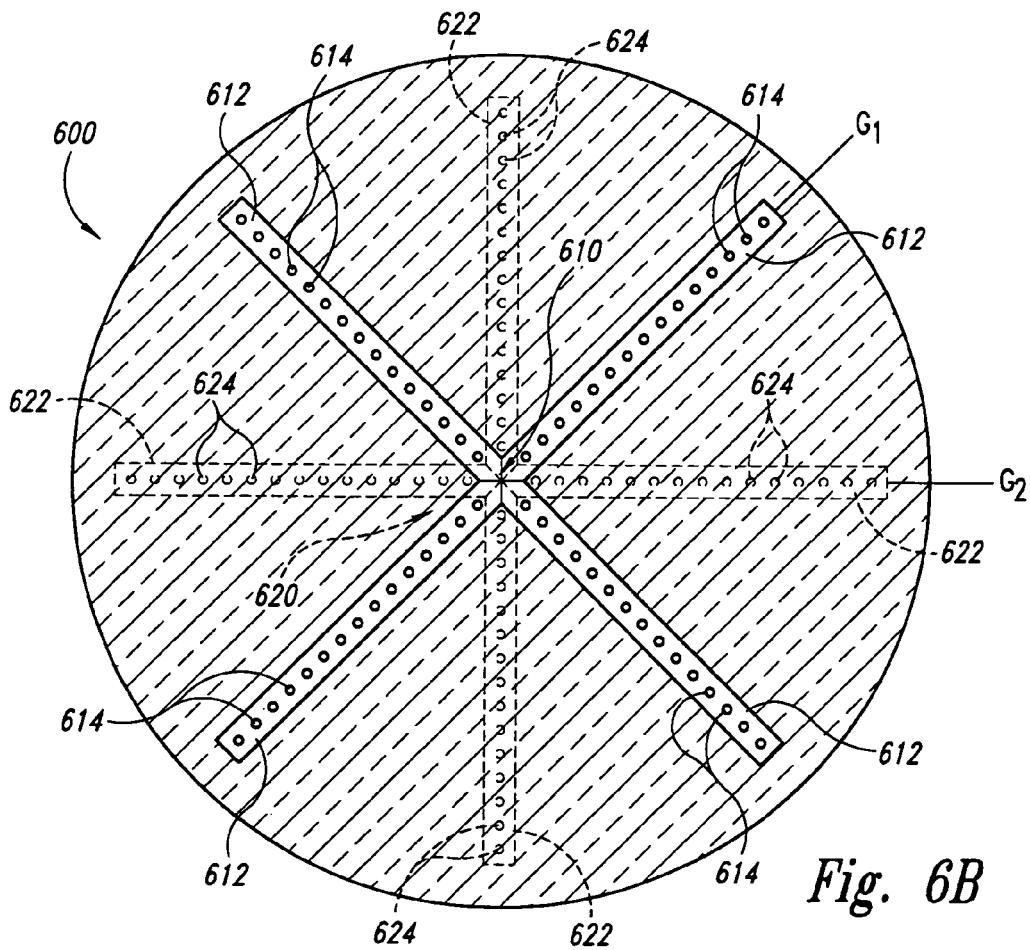

FIGS. 6A and 6B illustrate another embodiment of a plasma unit 600 for delivering two different gases $G_1$ and $G_2$ to the workpiece without mixing the gases $G_1$ and $G_2$ in the plasma unit 600. In this embodiment, the plasma unit 600 has a first portion 602 configured to face the energy system and a second portion 604 configured to face the workpiece. The plasma unit 600 further includes a first chamber 610 having a plurality of first conduits 612 and a plurality of first outlets 614 along the first conduits 612. The plasma unit 600 further includes a second chamber 620 having a plurality of second conduits 622 and a plurality of second outlets 624 along the second conduits 622. At least a portion of each first conduit 612 is not aligned with the second conduits 622 such that the first outlets 614 extend through the plasma unit 600 between the second conduits 622. The first outlets 614 extend to outlet openings underneath the first conduits 612, and the second outlets 624 extend to outlet openings underneath the second conduits 622.

The plasma unit 600 is suitable for ALD processes in which pulses of a first precursor gas $G_1$ flow through the first chamber 610 and pulses of a second precursor gas $G_2$ flow through the second chamber 620. The pulses can occur simultaneously for CVD process or at different intervals for ALD processes. The plasma unit 600 can form a plasma in one or both of the chambers 610 and 620. To deposit a layer of titanium, for example, pulses of a hydrogen plasma formed in the first chamber 610 from $H_2$ are distributed to the workpiece through the first outlets 614, and pulses of $TiCl_4$ in the second chamber 620 are distributed to the workpiece W through the second outlets 624. The pulses of the $H_2$ and $TiCl_4$ precursors can be separated by a purge gas to form a layer of titanium in an ALD process.

Figure 7:
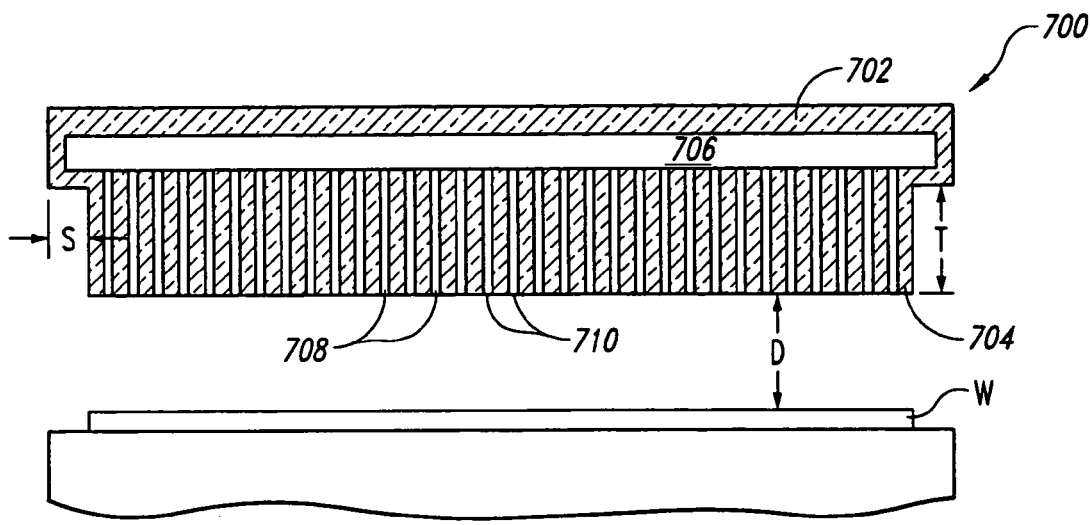
FIG. 7 is a cross-sectional view of a plasma unit for use in a plasma vapor processing system in accordance with another embodiment of the invention.

FIG. 7 is a schematic cross-sectional view illustrating a plasma unit 700 in accordance with another embodiment of the invention. In this embodiment, the plasma unit 700 has a first portion 702, a second portion 704, and a chamber 706 between the first and second portions 702 and 704. The plasma unit 700 further includes a plurality of outlets 708 extending through the second portion 704. The outlets 708 terminate at outlet openings 710 along the bottom surface of the second portion 704. The second portion 704 has a thickness T selected to position the outlet openings 710 from the workpiece W by a desired distance D. It will be appreciated that the distance D is selected according to the desired distribution of the processes gases across the workpiece W. The second portion 704 can also have a lateral dimension S to size the array of outlet openings 710 to the size of the workpiece W. One advantage of the plasma unit 700 is that different plasma units can be installed in a single processing vessel to provide the desired distribution of process gases to different types of workpieces. The thickness T, for example, can be adjusted to process workpieces having different types of devices. Similarly, the lateral dimension S can be changed to retrofit a 200 mm chamber to 300 mm chamber. This provides a significant advantage over conventional systems in which the distribution of gases cannot be tailored to accommodate different types of workpieces using the same chamber.

Figure 8:
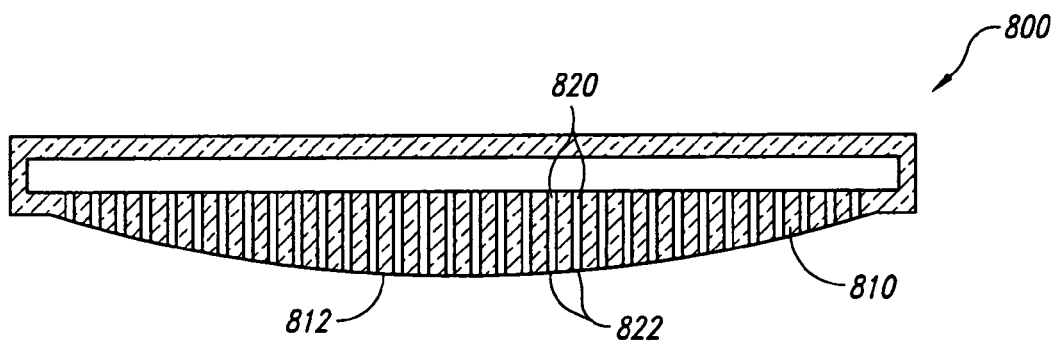
FIG. 8 is a cross-sectional view of a plasma unit for use in a plasma vapor processing system in accordance with another embodiment of the invention.

FIG. 8 illustrates another embodiment of a process unit 800 having a lower portion 810 with a contoured surface 812. The plasma unit 800 further includes a plurality of outlets 820 that terminate along the lower surface 812 at outlet openings 822. The plasma unit 800 provides a different distance between the outlet openings 822 and a workpiece (not shown in FIG. 8) to further control the distribution of process gases and/or plasma. It will be appreciated that the surface 812 can have a number of different configurations to provide the desired distribution of process gases across the workpiece.

Figure 9:
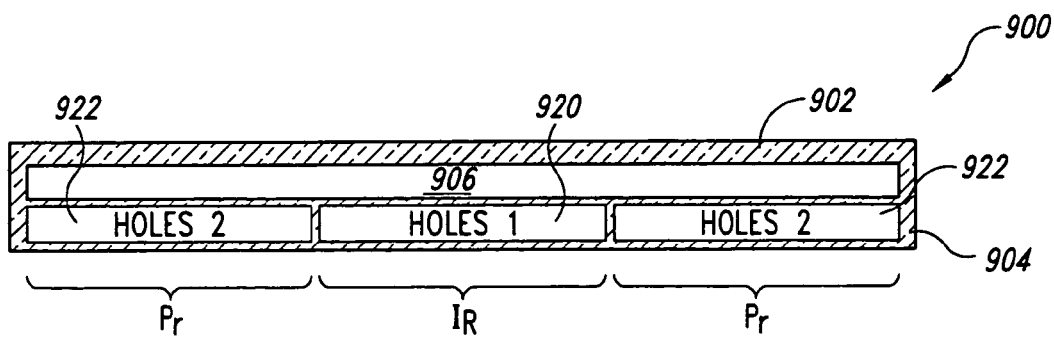
FIG. 9 is a cross-sectional view of a plasma unit for use in a plasma vapor processing system in accordance with another embodiment of the invention.

FIG. 9 is a schematic cross-sectional view of a plasma unit 900 in accordance with yet another embodiment of the invention. In this embodiment, the plasma unit 900 includes a first portion 902, a second portion 904, and a chamber 906 within the first and second portions 902 and 904. The second portion 904 of the plasma unit 900 includes a plurality of different outlets including a first plurality of holes 920 (shown schematically) and a second plurality of holes 922 (shown schematically). The first holes 920 can be arranged in an inner region $I_r$ and the plurality of second holes 922 can be arranged in a peripheral region $P_r$. The first holes 920 have a different characteristic than the second holes 922 to facilitate different distributions of processing gases across the workpiece. The first holes 920, for example, can have a larger diameter or different shape than the second holes 922. In another embodiment, the first holes 920 can have a higher density (i.e., occupy more surface area) than the second holes 922. It will be appreciated that the inverse is possible such that the second holes 922 can be larger and/or have a higher density than the first holes 920. In one embodiment, the inner region $I_r$ and the peripheral region $P_r$ can be discrete regions having a defined boundary. The transition between the inner region $I_r$ and the peripheral region $P_r$, however, can change along a continuum.

Figure 10:
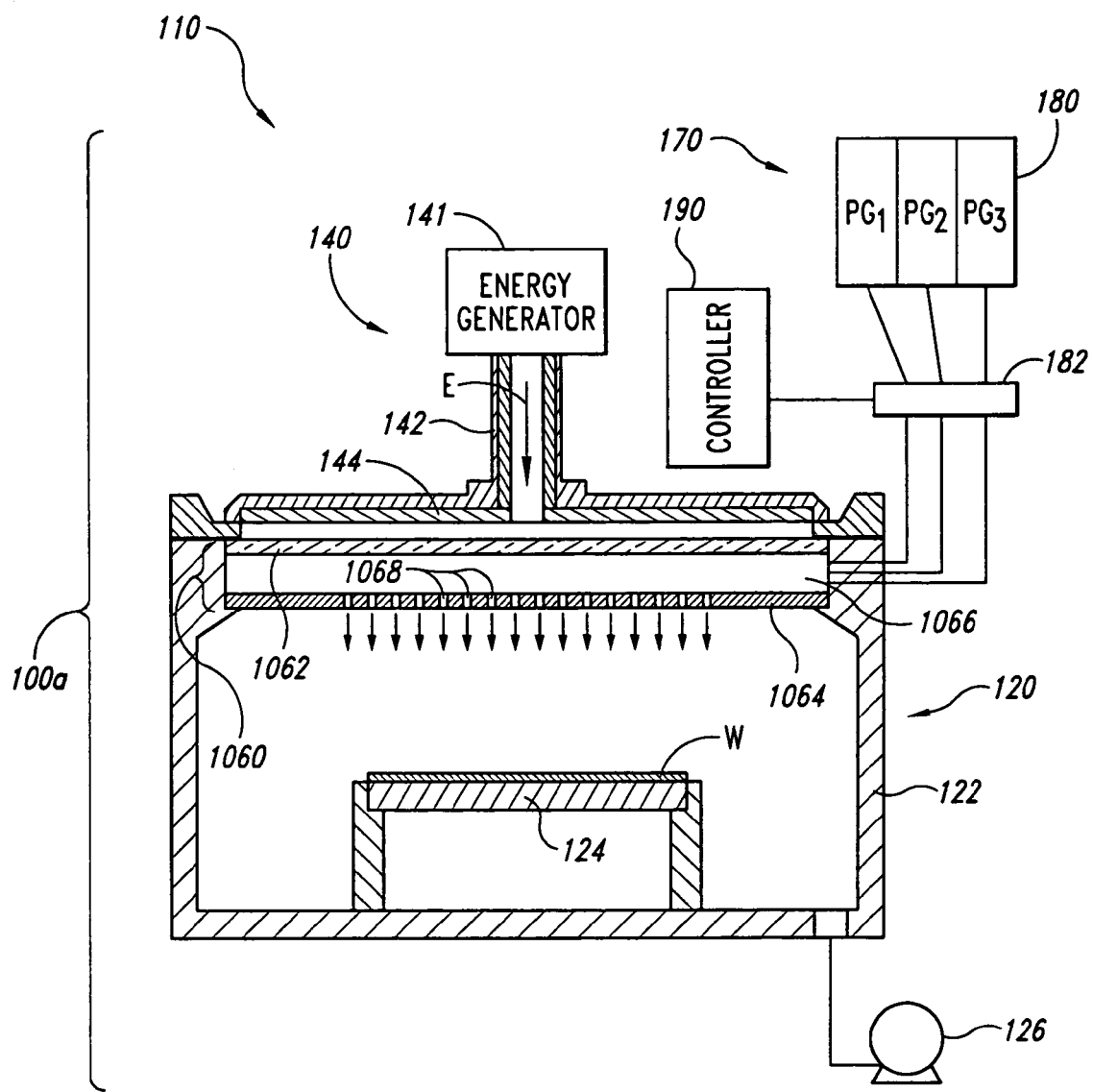
FIG. 10 is a schematic cross-sectional view of a plasma vapor processing system in accordance with another embodiment of the invention.

FIG. 10 is a schematic cross-sectional view of a plasma vapor processing system 100a in accordance with another embodiment of the invention. Like reference numbers refer to like components in FIGS. 3 and 10, and thus the description of such components will not be repeated with reference to the processing system 100a. The difference between the processing system 100 shown in FIG. 3 and the processing system 100a shown in FIG. 10 is that the processing system 100a has a plasma unit 1060 having a first portion 1062 separate from a second portion 1064. The first portion 1062 can be a window comprising quartz or another suitable material for transmitting the plasma energy E. The second portion 1064 is spaced apart from the first portion 1062 to define a chamber 1066 in which the inlet gases $G_{in}$ are injected. The sidewalls of the chamber 1066 can accordingly be an interior wall of the processing vessel 120 or a liner within the processing vessel 120. The plasma energy E propagates through the first portion 1062 and generates a plasma from an inlet gas $G_{in}$ in the chamber 1066. The plasma unit 1060 accordingly has a plurality of outlets 1068 in the second portion 1064 to dispense an outlet plasma $P_{out}$ relative to the workpiece W. The processing system 100a is expected to have similar performance characteristics as the processing system 100 shown in FIG. 3.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A plasma unit for distributing a plasma in the manufacturing of microfeature devices, comprising:
    a window having an upper portion composed at least in part of a material through which a plasma energy can propagate and a lower portion extending downward directly from the first portion, wherein the lower portion is composed of a non-conductive material that is transmissive to the plasma energy, and wherein the lower portion has an exterior surface configured to face a workpiece holder directly below the window;
    a chamber configured to receive the plasma energy passing through the window, the chamber having a first inlet for receiving a first gas and a second inlet for receiving a second gas, and wherein the chamber comprises a central hub enclosed within the window and a plurality of conduits extending through the window from the hub; and
    a plurality of holes extending through the lower portion of the window from the conduits to the exterior surface, wherein the holes define outlets arranged to distribute the plasma formed within the plasma unit directly over a workpiece juxtaposed to the plasma unit.

2. A plasma unit for generating a plasma therein and distributing plasma fluid in a plasma vapor reactor used in the manufacturing of microfeature devices, comprising:
    a quartz window having an upper surface and a lower surface;
    a chamber in the quartz window between the upper and lower surfaces;
    a gas supply having at least a first gas line configured to direct a first gas into the chamber and a second gas line configured to direct a second gas into the chamber; and
    a plurality of outlets arranged along the lower surface of the window in fluid communication with the chamber, wherein the chamber comprises a central hub in the window and a plurality of conduits extending through the window from the hub, and wherein the outlets comprise holes along the conduits that extend through the window.

3. The plasma unit of claim 2 wherein the chamber is within the window.

4. The plasma unit of claim 2 wherein the chamber comprises a cavity within the window and the outlets extend from the chamber and through a lower portion of the window.

* * * * *

UNITED STATES PATENT AND TRADEMARK OFFICE
CERTIFICATE OF CORRECTION

PATENT NO. : 7,581,511 B2  Page 1 of 1
APPLICATION NO. : 10/683424
DATED : September 1, 2009
INVENTOR(S) : Mardian et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 734 days.

Signed and Sealed this

Fourteenth Day of September, 2010

David J. Kappos
*Director of the United States Patent and Trademark Office*